(12) United States Patent
Chen

(10) Patent No.: US 6,939,220 B1
(45) Date of Patent: Sep. 6, 2005

(54) CONTROL STRUCTURE FASTENED WITH THE HOUSING OF AN ELECTRONIC DEVICE FOR REGULATING A COOLER OF THE ELECTRONIC DEVICE

(76) Inventor: Yung Cheng Chen, No. 7, Lane 398 Hung Chang 12th St., Chung Shan Li, Tao Yuan City (TW)

( * ) Notice: Subject to any disclaimer, the term of this patent is extended or adjusted under 35 U.S.C. 154(b) by 105 days.

(21) Appl. No.: 10/634,362

(22) Filed: Aug. 6, 2003

(51) Int. Cl.[7] .................................................. H05K 5/00
(52) U.S. Cl. ........................................ 454/184; 361/694
(58) Field of Search .......................... 454/184; 361/695, 361/694, 696; 165/122, 80.2, 104.33, 104.34; 312/236

(56) References Cited

U.S. PATENT DOCUMENTS

| | | | | |
|---|---|---|---|---|
| 4,942,805 A | * | 7/1990 | Hellwig et al. | ............. 454/184 |
| 5,782,687 A | * | 7/1998 | Sniegocki | ................... 454/184 |
| 6,301,110 B1 | * | 10/2001 | Kodaira | ...................... 361/697 |
| 6,439,992 B1 | * | 8/2002 | Demeter | ...................... 454/184 |
| 6,600,649 B1 | * | 7/2003 | Tsai et al. | .................... 361/697 |
| 6,668,565 B1 | * | 12/2003 | Johnson et al. | ................ 62/89 |
| 6,679,686 B2 | * | 1/2004 | Wang | ....................... 417/423.1 |
| 6,735,078 B2 | * | 5/2004 | Tsai | ........................... 361/695 |
| 6,735,884 B2 | * | 5/2004 | Fratello et al. | ............... 34/487 |

* cited by examiner

*Primary Examiner*—Derek S. Boles
(74) *Attorney, Agent, or Firm*—Harrison & Egbert

(57) ABSTRACT

A control structure is fastened with a housing of the electronic machine or the like for regulating the operation of a cooling device which is contained in the housing. The control structure comprises a control member and an adjustment member. The control member is fastened to an inner end of a vent of the housing and is provided with a regulating end which is connected to the cooling device for regulation the operation of the cooling device. The adjustment member is pivoted to an outer end of the vent of the housing and is connected with the regulating end of the control member. The regulating end of the control member is actuated by the adjustment member in motion. Both the control member and the adjustment member are fastened with the vent of the housing without obstructing the vent.

3 Claims, 7 Drawing Sheets

CONTROL STRUCTURE FASTENED WITH THE HOUSING OF AN ELECTRONIC DEVICE FOR REGULATING A COOLER OF THE ELECTRONIC DEVICE

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

1. Field of the Invention

The present invention relates generally to a cooler of the electronic device, and more particularly to a control structure fastened to the housing of the electronic device for regulating the cooler.

2. Background of the Invention

The electronic machine, such as a computer server, is generally provided in the interior with a cooling device which is operated at a predetermined speed to disperse the heat generated by the electronic machine. It is conceivable that the temperature of an environment, in which an electronic device is located, may vary from time to time. In light of such an environmental factor at work, the cooling effect of the cooling device is prone to imprecision. As a remedial measure, the housing of the electronic device is provided with an additional cooling device as well as an additional ventilation. This additional cooling device is also operated at a predetermined speed. As a result, the overall cooling effect is not improved to an extent that the energy efficiency of the electronic machine is meaningfully enhanced.

BRIEF SUMMARY OF THE INVENTION

The primary objective of the present invention is to provide an electronic machine with a control structure for regulating the operation of a cooling device of the electronic machine.

In keeping with the principle of the present invention, the foregoing objective of the present invention is attained by a control structure which is fastened to the housing of an electronic machine and is formed of a control member and an adjustment member. The control member is disposed in a vent of the housing and is provided with a regulating end for regulating the operation of a cooler of the electronic machine. The adjustment member is pivotally fastened to an outer portion of the vent and is provided with a connection portion which is connected to the regulating end of the control member. The operation of the cooler of the electronic machine can be thus adjusted as desired by manipulating the adjustment member. The control structure is disposed in such a way that the vent of the housing of the electronic machine is not obstructed.

The features and the advantages of the present invention will be more readily understood upon a thoughtful deliberation of the following detailed description of the present invention with reference to the accompanying drawings.

DETAILED DESCRIPTION OF THE INVENTION

Figure 1:
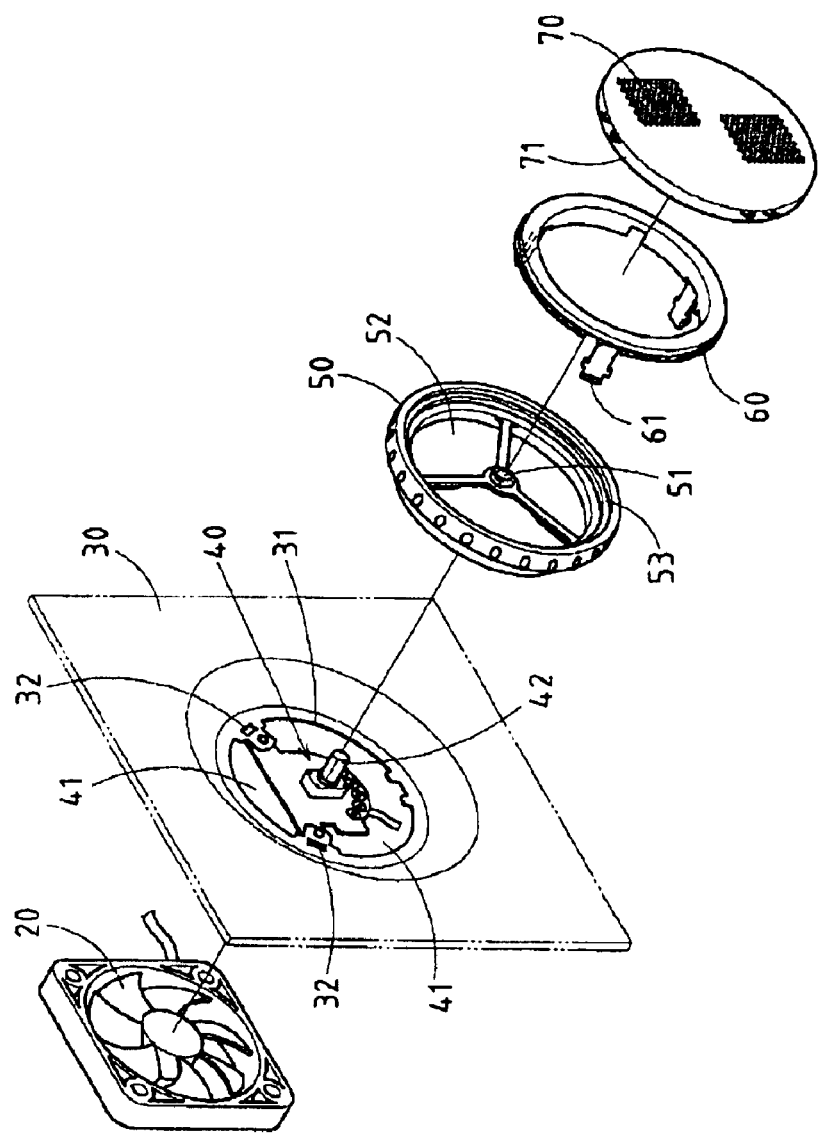
FIG. 1 shows an exploded view of the control structure of the present invention.
Figure 2:
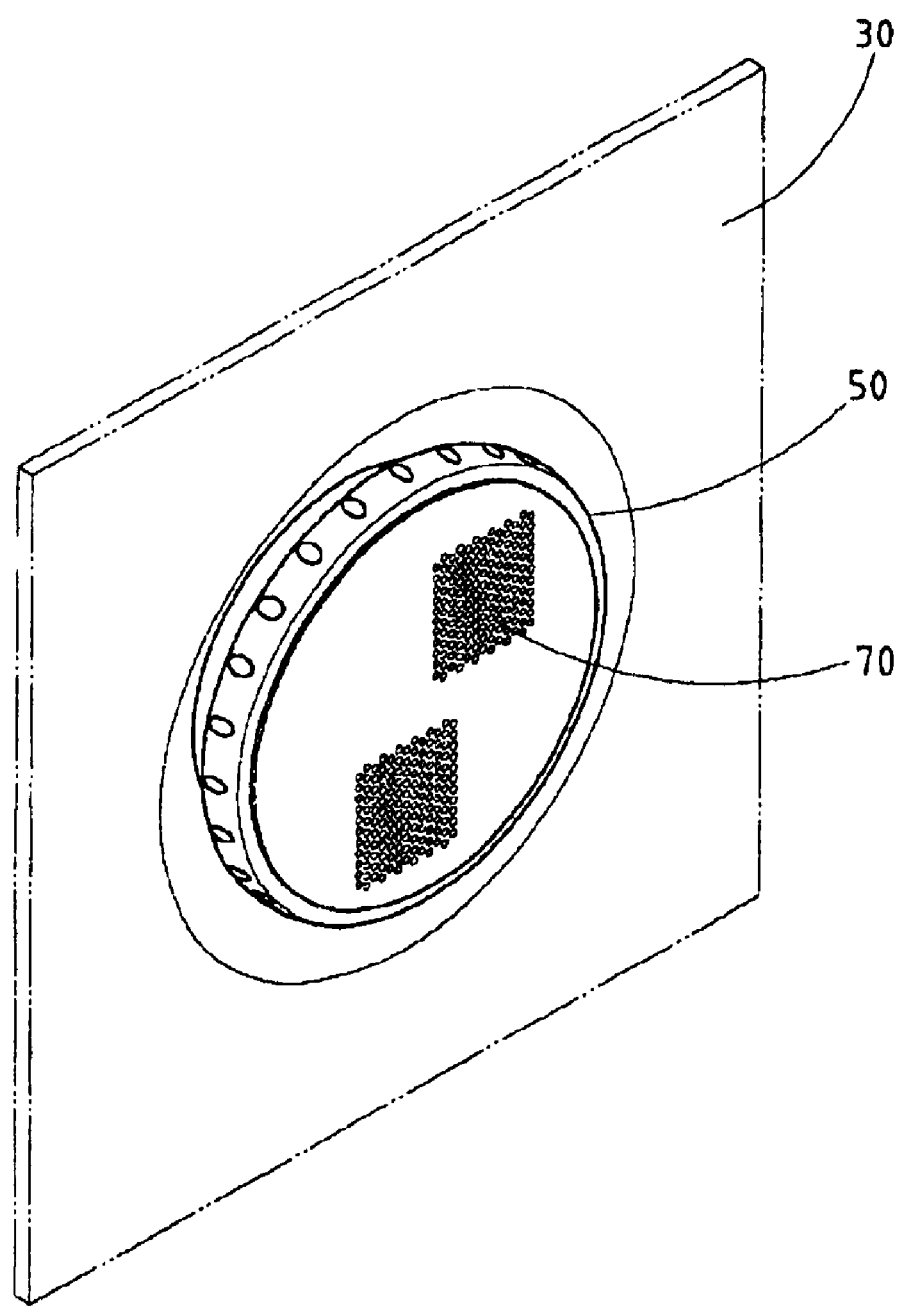
FIG. 2 shows a perspective view of the control structure of the present invention in combination.
Figure 3:
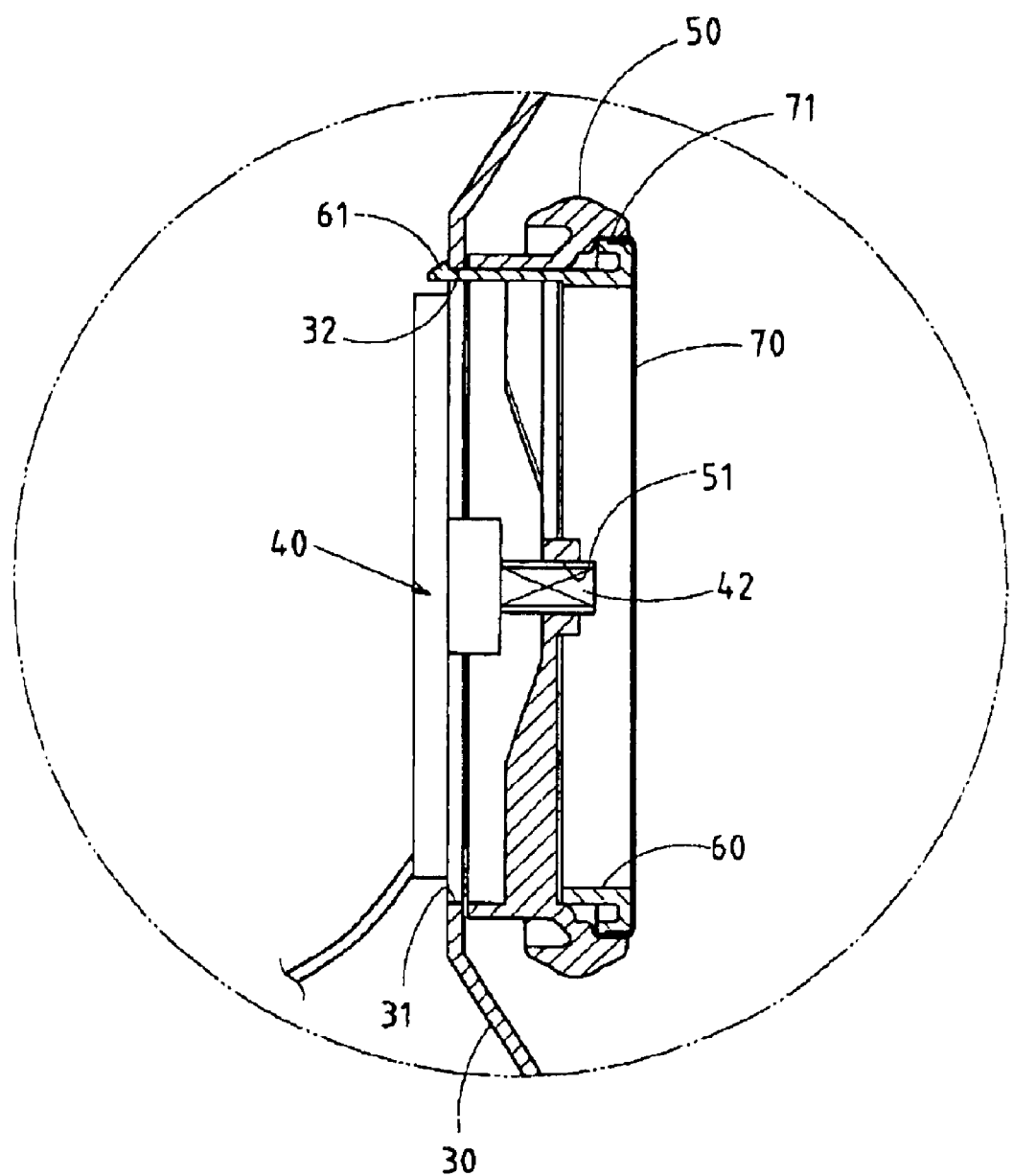
FIG. 3 shows a sectional schematic view of the control structure as shown in FIG. 2.
Figure 4:
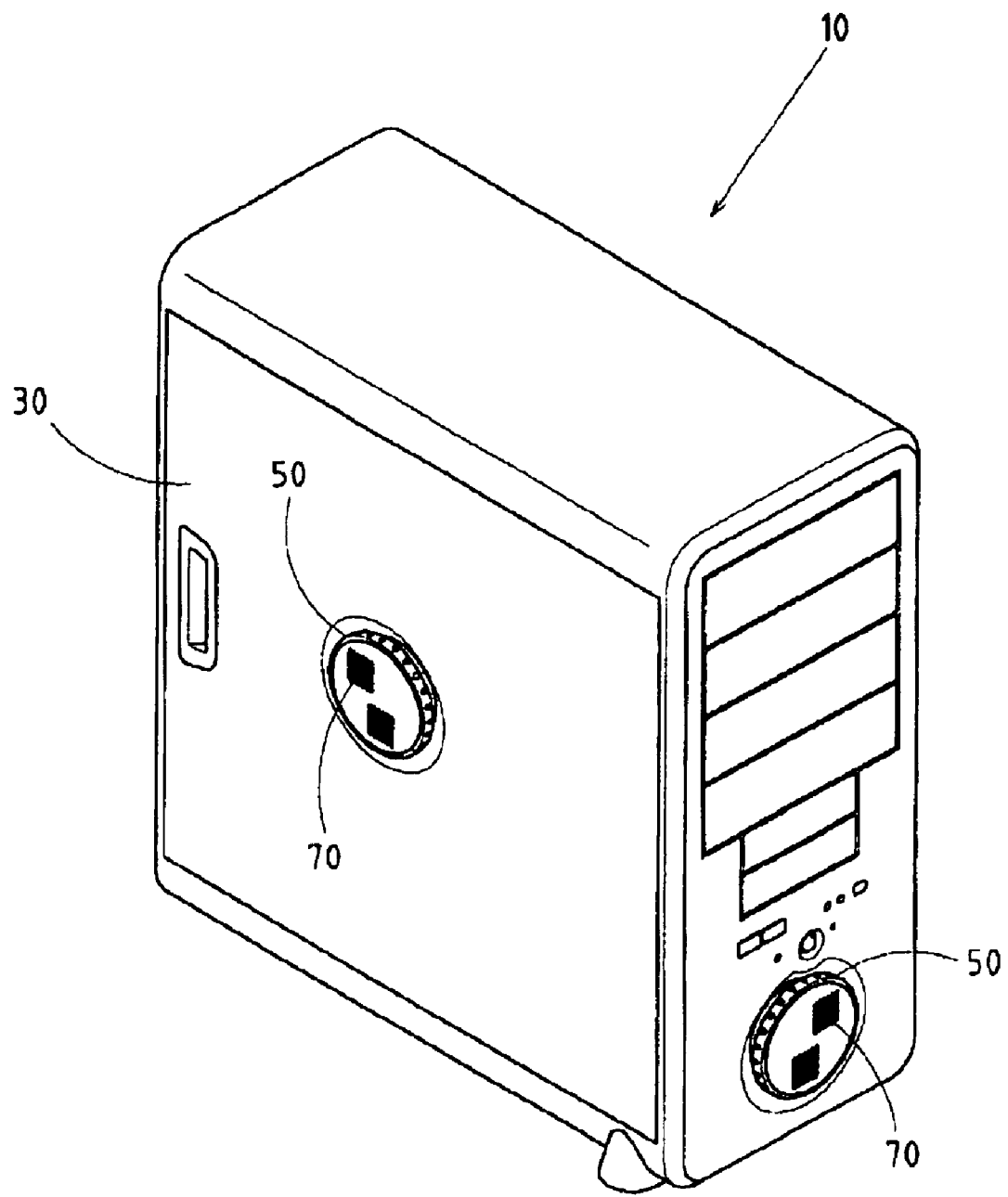
FIG. 4 shows a perspective view of a computer server comprising the control structure of the present invention.

As shown in FIGS. 1–5, an electronic machine 10, such as a computer server, comprises an electronic circuit element 11, a cooling device 20, such as a fan, and a housing 30. The housing 30 is provided with one or more vents 31.

A control structure embodied in the present invention is fastened with the housing 30 of the electronic machine 10 for regulating the operation of the cooling device 20. The control structure of the present invention comprises a control member 40 and an adjustment member 50.

The control member 40 is fixed in one of the vents 31 of the housing 30 of the electronic machine 10 in such a way that the control member 40 does not obstruct the vent 31, and that there are a plurality of gaps 41 between the control member 40 and the wall of the vent 31. The gaps 41 serve as gas passageways. The control member 40 is provided with a regulating end 42, which is connected to the cooling device 20 for regulating the operation of the cooling device 20.

The adjustment member 50 is pivoted to an outer end of the vent 31 by a pivoting member 60 such that a connection portion 51 of the adjustment member 50 is connected with the regulating end 42 of the control member 40. The adjustment member 50 is provided with a plurality of hollow portions 52 serving to prevent the adjustment member 50 from obstructing the vent 31 as well as the gaps 41 of the control member 40.

Figure 5:
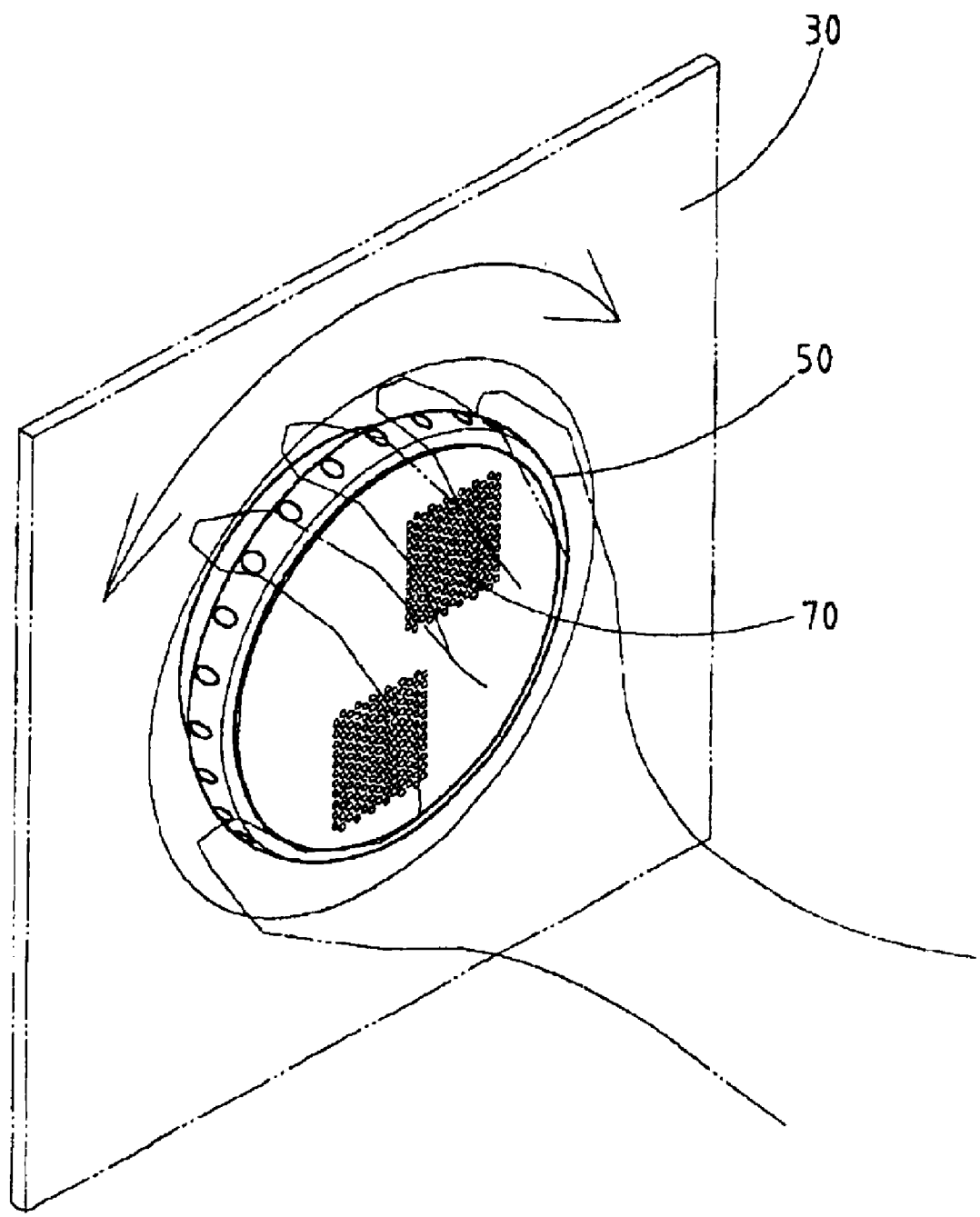
FIG. 5 shows a schematic view of operating procedure of the control structure of the present invention.

In operation, the regulating end 42 of the control member 40 is turned by the adjustment member 50 in motion, thereby resulting in adjustment of operation of the cooling device 20, as illustrated in FIG. 5.

The pivoting member 60 is provided with a plurality of retaining projections 61, which the vent 31 is provided with a plurality of retaining slots 32 in which the retaining projections 61 of the pivoting member 60 are held.

The adjustment member 50 is provided with a screen 70. The screen 70 has a locating edge 71 by which the screen 70 is secured to the pivoting member 60. The screen 70 serves to prevent the entry of a foreign matter into the control structure of the present invention.

Preferably, the adjusting member 50 has a circular shape to facilitate the turning of the adjustment member 50 with fingers. The adjusting member 50 is provided with an annular shoulder 53 for embracing the pivoting member 60.

Figure 6:
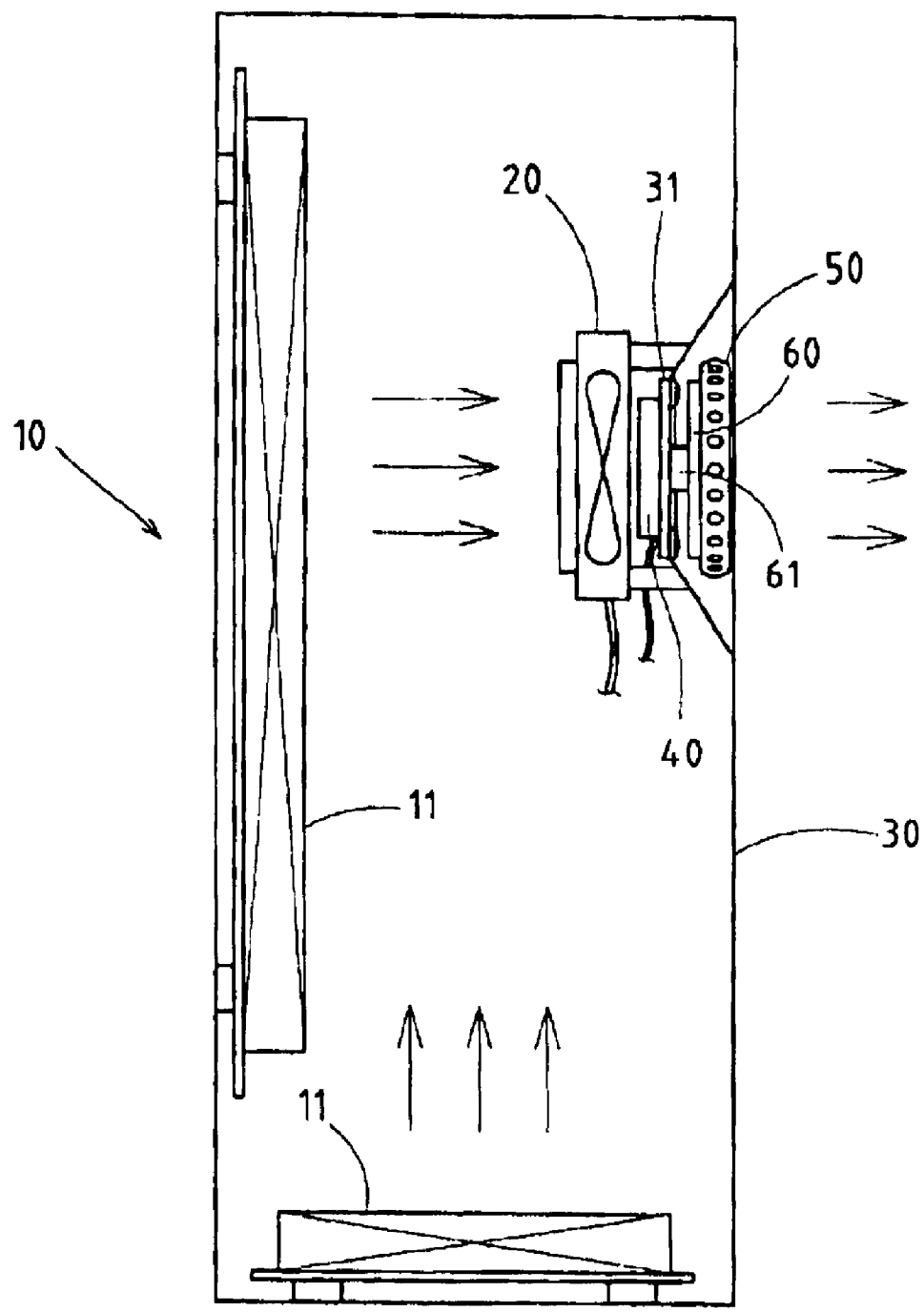
FIG. 6 shows a sectional schematic view of the control structure of the present invention in relation to a cooling device of the electronic machine.
Figure 7:
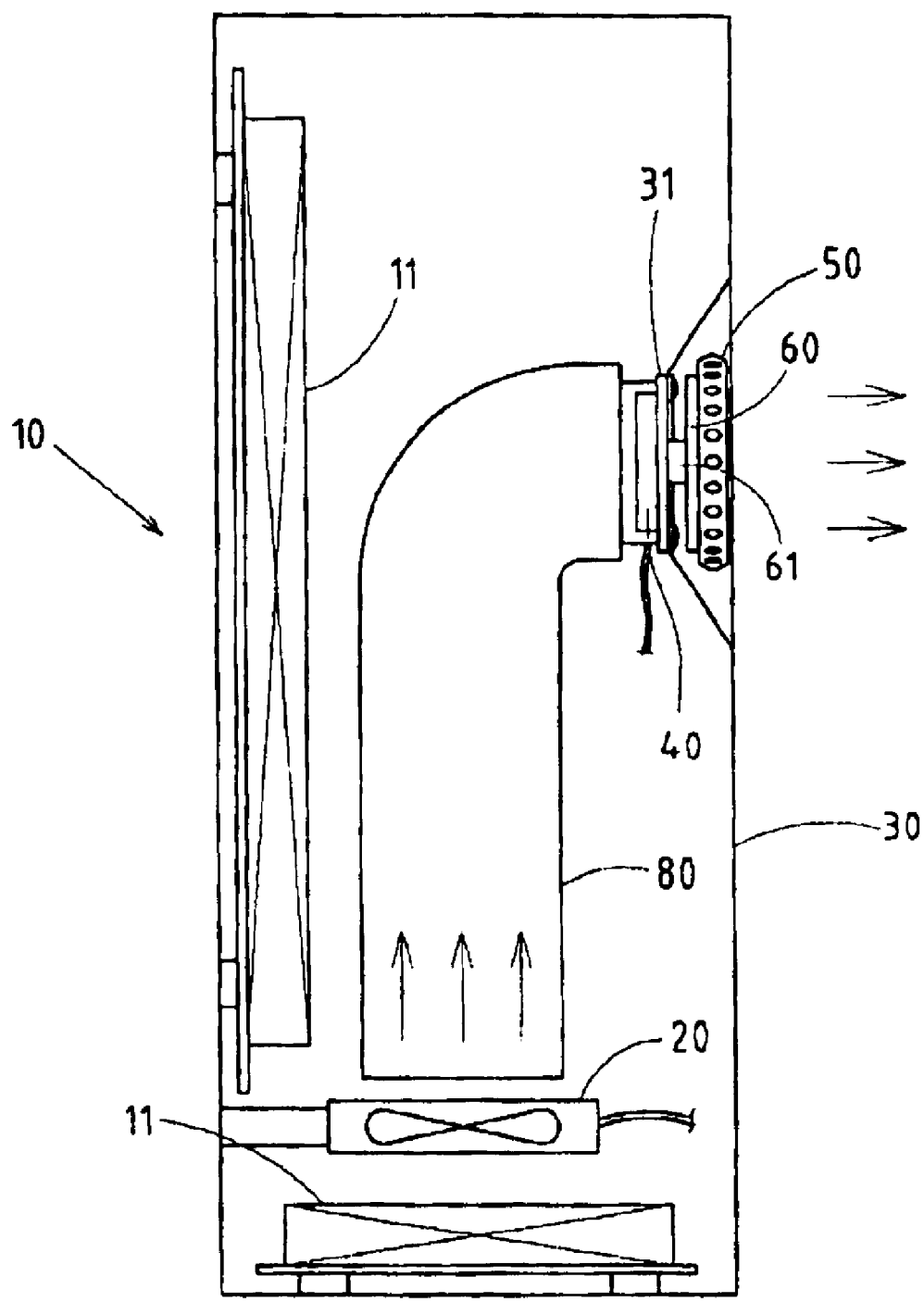
FIG. 7 shows another sectional schematic view of the control structure of the present invention in relation to a cooling device of the electronic machine.

Depending on the location of the vent 31 of the housing 30, the control structure of the present invention may be situated in a close proximity of the cooling device 20 of the electronic machine 10, as shown in FIG. 6, or away from the cooling device 20 by a distance, as shown in FIG. 7. In the latter case, a duct 80 is provided to guide the escape of the warm air through the vent 31.

The embodiment of the present invention described above is to be regarded in all respects as being illustrative and nonrestrictive. Accordingly, the present invention may be embodied in other specific forms without deviating from the spirit thereof. The present invention is therefore to be limited only by the scope of the following claims.

I claim:

1. A control structure of a cooling device contained in a housing of an electronic machine or the like, said control structure being fastened to a vent of the housing and comprising:

a control member fastened to an inner end of the vent of the housing without obstructing the vent, said control member being comprised of a regulating end whereby said regulating end is connected to the cooling device for regulating operation of the cooling device; and an adjustment member fastened pivotally to an outer end of the vent of the housing without obstructing the vent such that said adjustment member is connected to said regulating end of said control member, and such that said adjustment member can be turned to actuate said regulating end of said control member.

2. The control structure as defined in claim 1, wherein said control member and said adjustment member are comprised of a plurality of hollow portions in communication with the vent of the housing.

3. The control structure as defined in claim 1, wherein said adjustment member is comprised of a protective screen.

* * * * *